(12) United States Patent
Berkhout

(10) Patent No.: US 7,782,135 B2
(45) Date of Patent: Aug. 24, 2010

(54) POWER AMPLIFIER

(75) Inventor: Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/446,965

(22) PCT Filed: Oct. 18, 2007

(86) PCT No.: PCT/IB2007/054248

§ 371 (c)(1),
(2), (4) Date: Apr. 23, 2009

(87) PCT Pub. No.: WO2008/050267

PCT Pub. Date: May 2, 2008

(65) Prior Publication Data

US 2010/0013555 A1   Jan. 21, 2010

(30) Foreign Application Priority Data

Oct. 25, 2006   (EP) ................... 06122947

(51) Int. Cl.
*H03F 3/217* (2006.01)
(52) U.S. Cl. ............... 330/251; 330/207 A; 330/10
(58) Field of Classification Search ......... 330/251, 330/207 A, 10
See application file for complete search history.

(56) References Cited

U.S. PATENT DOCUMENTS

| 4,992,677 | A | | 2/1991 | Ishibashi et al. | |
|---|---|---|---|---|---|
| 5,731,672 | A | * | 3/1998 | Miyaguchi | 318/293 |
| 5,850,159 | A | | 12/1998 | Chow et al. | |
| 5,930,132 | A | | 7/1999 | Watanabe et al. | |
| 6,208,177 | B1 | | 3/2001 | Knoedl, Jr. | |
| 6,208,185 | B1 | | 3/2001 | John et al. | |
| 6,362,683 | B1 | * | 3/2002 | Miao et al. | 330/10 |
| 6,366,062 | B2 | * | 4/2002 | Baretich et al. | 323/223 |
| 6,597,131 | B2 | * | 7/2003 | Ito et al. | 315/308 |
| 6,639,815 | B1 | * | 10/2003 | Gucyski | 363/40 |
| 6,949,915 | B2 | * | 9/2005 | Stanley | 323/207 |
| 6,992,520 | B1 | | 1/2006 | Herbert | |
| 2004/0070377 | A1 | | 4/2004 | Bai et al. | |
| 2005/0068100 | A1 | | 3/2005 | Nagasue | |
| 2005/0269969 | A1 | | 3/2005 | Lee et al. | |
| 2010/0001704 | A1 | * | 1/2010 | Williams | 323/283 |

OTHER PUBLICATIONS

Berkhout, Marco; "A Class-D Output Stage With Zero Dead Time"; ISSCC Dig. Tech Papers; pp. 134-135; Feb. 2003.
Berkhout, Marco; "An Integrated 200-W Audio Amplifier"; IEEE Journal of Solid-State Circuits; vol. 38, No. 7; Jul. 2003; p. 1198-1206.

(Continued)

*Primary Examiner*—Patricia Nguyen

(57) ABSTRACT

A driver (Highside Driver, Lowside Driver) adapted to drive each of final transistors ($M_H$, $M_L$, $M_{power}$) included in a power amplifier, the driver including: a first plurality of switches ($M_{pslow}$, $M_{pmoderate}$, $M_{pfast}$) having their respective main current channels coupled between a bias voltage terminal ($V_{ddx}$) and a control electrode of the respective final transistors ($M_H$, $M_L$, $M_{power}$), said first plurality of switches ($M_{pslow}$, Mpmoderate, Mpfast) being selectively turned ON for enabling a progressive charging of the respective control electrode of the final transistors ($M_H$, $M_L$, $M_{Power}$), a second plurality of switches ($M_{nslow}$, $M_{nfast}$) having their respective main current channels coupled between another bias voltage terminal ($V_{source}$) and the control electrode of the respective final transistors ($M_H$, $M_L$, $M_{power}$), said second plurality of switches ($M_{nslow}$, $M_{nfast}$) being selectively switched ON until a current through the respective final transistors ($M_H$, $M_L$, $M_{power}$) changes its polarity.

8 Claims, 7 Drawing Sheets

OTHER PUBLICATIONS

Berkhout, Marco; "Integrated Overcurrent Protection System for Class-D Audio Power Amplifiers"; IEEE Journal of Solid-State Circuits, IEEE Service Center; Piscataway, NJ, US vol. 40, No. 11; Nov. 2005; pp. 2237-2245; XP011141632; ISSN: 0018-9200.

* cited by examiner

POWER AMPLIFIER

FIELD OF THE INVENTION

The invention relates to a power amplifier.

BACKGROUND OF THE INVENTION

A typical class-D output stage comprises two n-type power MOSFETs in a totempole configuration as shown in FIG. 1. The output node $V_{out}$ is switched between the supply lines using pulse-width modulation (PWM). An LC-low-pass filter is usually inserted between the output node $V_{out}$ and the load, which may be a loudspeaker for filtering out the high frequency content of a signal delivered by the amplifier. Inverters Mph/nh and Mpl/nl drive the gates of the power MOSFETs MH and ML. The dimensions of these inverters together with the parasitic capacitances Cgdl and Cgdh of the power MOSFETs determine the dynamic behavior of the class-D output stage. FIG. 2 shows some typical waveforms that occur during a falling transition at the output when no output current is flowing. $V_{gsl}$ is the gate-source voltage of the lowside power MOSFET $M_L$ and $V_{gsh}$ is the gate-source voltage of the highside power MOSFET $M_H$. In this case the highside power MOSFET $M_H$ is switched off while the lowside power MOSFET $M_L$ is switched on. As can be seen three phases can be distinguished in the transition. In phase I the gate of the highside power MOSFET $M_H$ is discharged rapidly while the gate of the lowside power MOSFET $M_L$ is charged. In a properly dimensioned output stage the highside power MOSFET $M_H$ will be switched off before the lowside power MOSFET $M_L$ starts to conduct, i.e. before the gate-source voltage $V_{gsl}$ reaches the threshold voltage $V_T$. The output voltage $V_{out}$ remains where it is during this phase. In phase II $V_{gsl}$ crosses the threshold level and the lowside power MOSFET $M_L$ starts conducting, thus pulling down the output node $V_{out}$. This determines the typical stalling of $V_{gsl}$ because during the transition all available charging current will be flowing into the gate-drain capacitance $C_{gdl}$ of the lowside power MOSFET $M_L$. The speed of the transition is governed by the size of $M_{pl}$ and the gate-drain capacitance $C_{gdl}$. Finally, in phase III the transition of the output node $V_{out}$ has ended and $V_{gsl}$ rises again to its final value which is typically a few times the threshold voltage $V_T$ of the transistor. The waveforms that occur during a rising transition at the output are similar but the role of the highside and lowside power MOSFETs is interchanged. The speed of the transition can be controlled by the size of the driver transistors. However, the ratio of the driver transistors Mph/Mnl (or Mpl/Mnh) is fixed to guarantee reliable operation. In general the NMOS transistors in the driver need to be more powerful (low-ohmic) than the PMOS transistors in order to avoid cross conduction. As it is shown in M. Berkhout, "A Class-D Output Stage with Zero Dead Time", ISSCC Dig. Tech. Papers, pp. 134-135, February 2003.

The situation changes significantly if a substantial current $I_{out}$ flows from or towards the output stage. FIG. 3 depicts the waveforms when a large current flows from the amplifier. Now during phase I as soon as $V_{gsh}$ starts to fall the output current $I_{out}$ pulls down the output node $V_{out}$ immediately entering phase II. This transition is so fast that the highside power MOSFET is not switched off completely but remains conducting during the transition. In this case the speed of the transition is actually governed by the size of driver transistor $M_{nh}$ and gate-drain capacitance $C_{gdh}$. At the lowside $V_{gsl}$ initially starts to rise but is then pushed down through $C_{gdl}$. Although there still is no cross conduction the output transitions tend to become much faster then in the case where no output current is flowing. After the transition has finished the gate of the lowside power MOSFET is charged to its final value during phase III.

FIG. 4 shows the waveforms when a large output current $I_{out}$ flows towards the output stage. In phase I the gate of the highside power MOSFET $M_H$ is discharged causing the output current to flow through the back-gate diode of $M_H$. At the same time the gate of the lowside power MOSFET $M_L$ is charged. Now as $V_{gsl}$ reaches the threshold level the lowside power MOSFET $M_L$ starts to conduct but the output node $V_{out}$ remains at the highside until the current through $M_L$ matches the output current $I_{out}$ causing $V_{gsl}$ to increase further. Now the most important problem occurs. When the output node $V_{out}$ is pulled down the voltage across the (conducting) back-gate diode is reversed. This results in a reversal of the diode current due to a well-known effect called reverse recovery. In the lowside power MOSFET $M_L$ the reverse recovery current adds to the output current causing $V_{gsl}$ to increase even further. The reverse recovery current tends to stop quite abruptly when the diode runs out of minority carriers. However at the lowside power MOSFET $M_L$ the gate-source voltage $V_{gsl}$ has by now reached a value that corresponds to the output current plus the reverse recovery current which is almost equal to the output current $I_{out}$. As a result the output node $V_{out}$ is initially pulled down very fast. Then feedback through the gate-drain capacitance $C_{gdl}$ causes $V_{gsl}$ to be pushed down causing a characteristic 'overshoot' in $V_{gsl}$. Also the gate of the highside power MOSFET $M_H$ is pulled up which can lead to additional peak current if the threshold voltage $V_T$ is exceeded. After this rapid start the transition is continued at a more moderate pace during phase II and in phase III the charging of the gate of lowside power MOSFET $M_L$ is finished. The occurrence of reverse recovery and especially the rapid decrease of the reverse recovery current is probably the most important source of EMI i.e. electromagnetic Interference, in class-D amplifiers.

SUMMARY OF THE INVENTION

It is an object of present invention to provide a power amplifier having a reduced electromagnetic interference (EMI). The invention is defined by the independent claims. Dependent claims define advantageous embodiments.

The invention is achieved in a driver for each of final transistors ($M_H$, $M_L$, $M_{Power}$) included in a power amplifier, the driver including:
  a first plurality of switches having their respective main current channels coupled between a bias voltage terminal and a control electrode of the respective final transistors, said first plurality of switches being selectively turned ON for enabling a progressive charging of the respective control electrode of the final transistors,
  a second plurality of switches having their respective main current channels coupled between another bias voltage terminal and the control electrode of the respective final transistors, said second plurality of switches being selectively switched ON until a current through the respective final transistors changes its polarity.

An advantage of this invention is that the claimed driver helps to avoid reverse recovery by keeping the corresponding power transistor switched ON until the current through it changes polarity.

In an embodiment of the invention the first plurality of switches comprises p-MOS transistors having different sizes and the second plurality of switches comprises n-MOS transistors having different sizes. Hence, the p-MOS transistors provide different sizes in the different phases of charging. In phase I a 'slow' p-MOS is used to build up the current through the power MOSFET relatively slow. Then as soon as the output voltage of the power amplifier changes in phase II a second 'moderate' p-MOS is added to enable a relatively fast transition. Finally, after the transition in phase III a third 'fast' p-MOS is added to enable a fast finish of the gate charging.

In another embodiment of the invention said driver is coupled to another driver. The first plurality of switches of each driver is coupled to a first control circuit. The second plurality of switches of each driver being coupled to a second control circuit, the second control circuit being adapted to receive a PWM input signal and to generate respective second controlling signals for each of the switches included in the second plurality of switches, respectively. The first control circuit receives the PWM input signal. Each of the second control circuit of the driver provides an additional control signal to the respective first control circuit of the other driver. Each of the second control circuit and generates respective first control signals for each of the switches included in the first plurality of switches.

Therefore, said pluralities of switches are controlled in different modes by different circuitry such that the EMI is reduced.

In an embodiment of the invention the second control circuit comprises a first comparator for comparing a voltage at an end of the main current channel of the respective final transistor and a voltage at the other end of the main current channel of said final transistor and generating a first comparator signal. Said second control circuit further comprises a second comparator for comparing a threshold voltage of the respective final transistor with a voltage of the control electrode of the same final transistor and generating the controlling signals provided for the first control circuit of the other driver, and logic circuitry for combining the PWM input signal with the control signal and the first comparator signal (reverse), the logic circuitry generating respective second controlling signals for the respective control electrodes of the second plurality of switches.

Preferably, the first comparator is a very fast comparator to determine the polarity of the drain-source voltage of the power transistor. The second comparator comprises an inverter including a first transistor having substantially the same parameters as the final transistor the driver is acting on, the inverter further comprising a second transistor having a substantially smaller size than the first transistor, said transistor having their respective control electrodes coupled to each other and further coupled to the control electrode of the respective final transistor. The first comparator is a current comparator for comparing a current through a respective final transistor with a current through a scaled down replica of the respective final transistor. The first control circuit comprises a first inverter (M1, M2) coupled to a second inverter (M6, M7), the second inverter being controlled by a back-gate diode of one of the transistors included in said inverter.

In another embodiment of the invention the first control circuit of each driver further comprises a latch circuit that is reset by the input signal, said latch being set by the control signal of the respective other driver.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
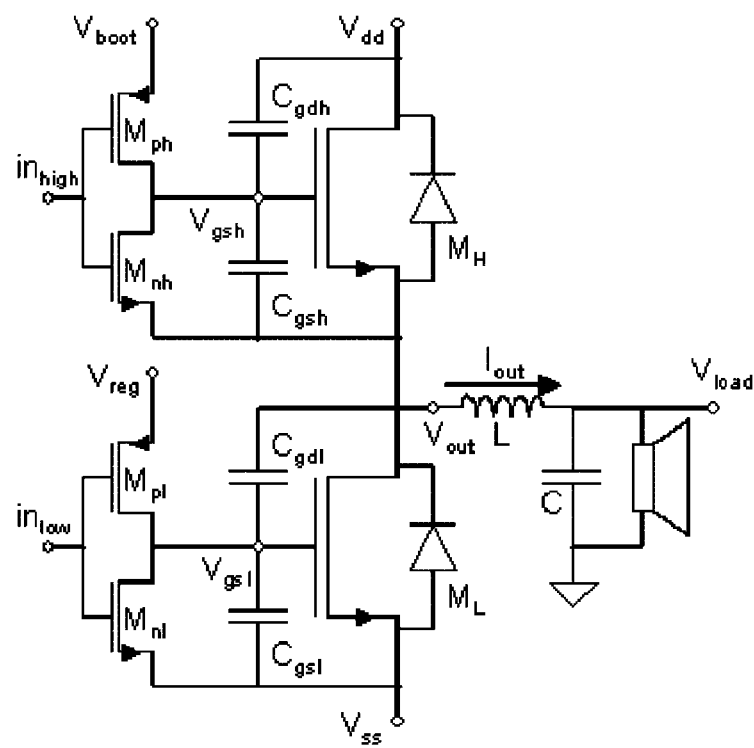
FIG. 1 depicts a known class D power amplifier.
Figure 5:
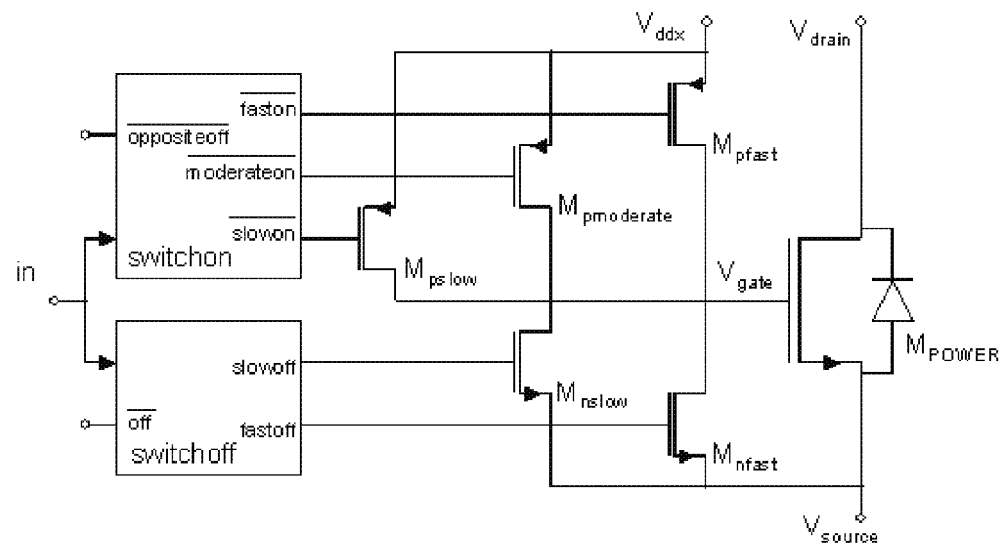
FIG. 5 depicts a power transistor with its respective driver, according to the invention.

FIG. 5 depicts a block diagram of the invention. The block labeled switchon controls p-MOS transistors, and the block labeled switchoff drive n-MOS transistors. The same implementation is used for both lowside and highside power MOSFETs shown in FIG. 1. Node $V_{ddx}$ denotes $V_{reg}$ for the lowside or $V_{boot}$ for the highside. The operation of the switchon and switchoff blocks is explained through analyzing a falling transition at the output. First let us consider that the highside power MOSFET $M_H$ is switched OFF. Independent of the size or direction of the output current $I_{out}$ the p-MOS drivers can be switched OFF immediately. In case the output current $I_{out}$ is very small or flows from the output stage the gate of highside power MOSFET $M_H$ is discharged by the 'slow' NMOS $M_{nhslow}$ i.e. a transistor having a small size. As soon as the gate of the highside power MOSFET $M_H$ is below the threshold level the 'fast' NMOS $M_{nhfast}$ i.e. a transistor having a larger size than the previous one, is also switched ON in order to 'lock' the off state. In case the output $I_{out}$ current flows towards the output stage highside power MOSFET $M_H$ remains conducting until the current through the lowside power MOSFET $M_L$ matches the output current thus reversing the current direction through highside power MOSFET $M_H$. Then the 'fast' NMOS $M_{nhfast}$ discharges the gate of the highside power MOSFET $M_H$ immediately.

Figure 6:
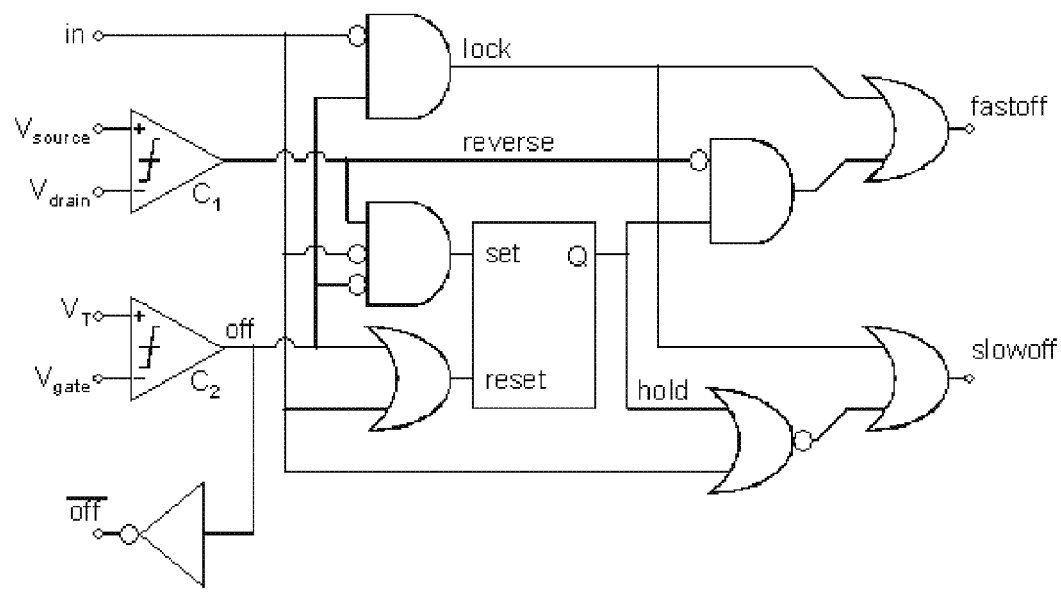
FIG. 6 depicts a switchoff circuit, according to an embodiment of the invention.

FIG. 6 depicts an implementation of the switchoff circuit. The circuit contains two comparators and some logic. Comparator $C_2$ compares the gate voltage $V_{gate}$ of the highside power MOSFET to the threshold level to determine if the highside power MOSFET is switched ON or OFF. Comparator $C_1$ compares the drain voltage $V_{drain}$ and source voltage $V_{source}$ of the highside power MOSFET to determine the direction of the current through the highside power MOSFET. Initially the input signal in is high and consequently the signals lock, hold and off are low. Also both output signals slowoff and fastoff are low. The value of signal reverse depends on the direction of the current through the (highside) power MOSFET. In case current flows in the forward direction (from drain to source) the signal reverse is low. Now when the input signal in goes low output signal slowoff goes high. This causes the 'slow' NMOS $M_{nslow}$ in the highside driver to be switched on that slowly starts to discharge the gate of the highside power MOSFET. When the gate voltage Vgate crosses the threshold level $V_T$ the signal off goes high. This causes signal lock and output signal fastoff to go high as well. In case current flows in the reverse direction (from source to drain) the signal reverse is high. Now when the input signal in goes low the latch is set and the signal hold also goes high which prevents output signal slowoff to go high so initially nothing happens at the gate of the (highside) power MOSFET. Now because the opposite (lowside) power MOSFET starts to build up current the current through the (highside) power MOSFET decreases and reverses direction. When this happens the signal reverse goes low and signal fastoff goes high. This causes the 'fast' NMOS $M_{nfast}$ in the driver to be switched on that discharges the gate of the (highside) power MOSFET fast. When the gate voltage Vgate crosses the threshold level $V_T$ the signal off goes high. This causes signal lock and output signal slowoff to go high and the latch to be reset again. When input signal goes high again both output signals slowoff and fastoff go low immediately so the gate of the power MOSFET can be charged. The signal /off or $\overline{off}$ is the inverse of the signal off. In general, throughout this application, the "/X" or "$\overline{X}$" notations are used to indicate the negate or inverse of a signal X. The purpose of this signal will be explained later in the context of the operation of the switchon circuit.

Figure 7:
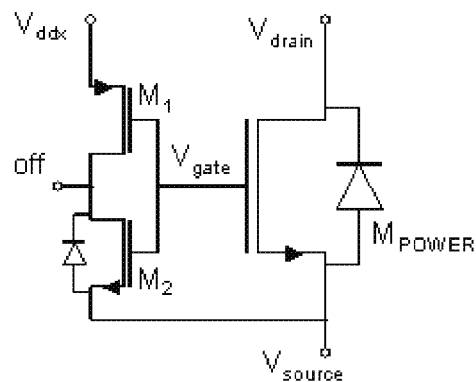
FIG. 7 depicts a detector of the threshold level, according to the invention.

The implementation of comparator $C_2$ can be done with a simple inverter as shown in FIG. 7. By making the NMOS $M_2$ of the same type as the power MOSFET and much larger than the PMOS $M_1$ the trip level of the inverter is close to the threshold level $V_T$ of the power MOSFET. The output signal off is high when the gate voltage $V_{gate}$ of the power MOSFET is below $V_T$.

Figure 8:
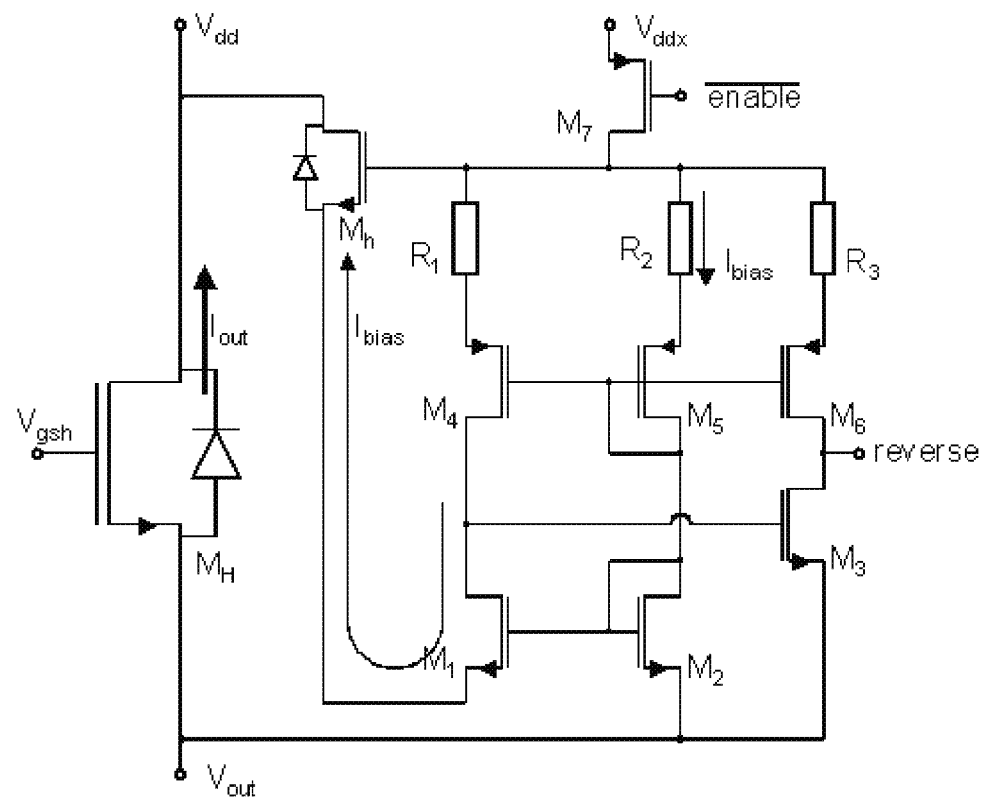
FIG. 8 depicts a current comparing circuit, according to the invention.

The implementation of comparator $C_1$ is shown in FIG. 8. Transistors $M_1$ and $M_2$ form a common gate input pair of the comparator. The branch consisting of $M_2$, $M_5$ and $R_2$ also serve as biasing circuit. Transistor $M_h$ is a scaled 1:N replica of the highside power MOSFET $M_H$. The source voltages of $M_1$ and $M_2$ are equal when the (reverse) current flowing through the highside power MOSFET $M_H$ equals $N*I_{bias}$, which means the output signal reverse goes low before the current through the highside MOSFET $M_H$ equals zero. In this way the finite speed of the comparator circuit and subsequent discharge of the gate of the highside power MOSFET is compensated. For high speed the comparator needs to be biased at a large current. This is a problem especially for the highside driver since it is supplied from a bootstrap capacitor that is discharged by this bias current. The average current consumption of the comparator can be reduce substantially by switching it on just before the highside power MOSFET is switched off and disabling it right after by means of switch $M_7$.

Figure 9:
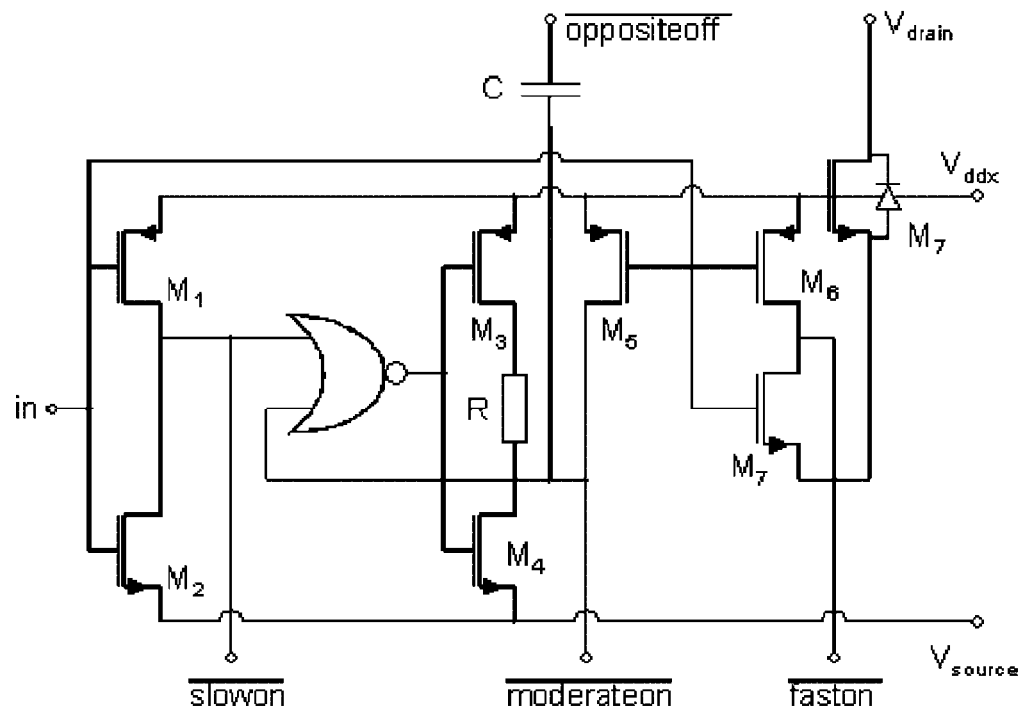
FIG. 9 depicts the switchon circuit, according to an embodiment of the invention.

FIG. 9 shows an implementation of the switchon circuit. When the input signal in is low then transistors $M_1$, $M_5$ and $M_6$ are switched on and all output signals /slowon, /moderateon and /faston are high so the PMOS drivers $M_{pslow}$, $M_{pmoderate}$ and $M_{pfast}$ are switched off. When the input signal goes high phase I starts and output signal /slowon goes low immediately causing 'slow' PMOS driver $M_{pslow}$ to slowly charge the gate of the (lowside) power MOSFET. At the same time the discharging of the gate of the opposite (highside) power MOSFET starts. As explained earlier a signal off and its inverse /off is generated in the switchoff circuit. The signal /off goes low as soon as the gate of the (highside) power MOSFET goes below the threshold voltage $V_T$ starting phase II. The signal /off of the opposite (highside) switchoff is connected to input /oppositeoff of the (lowside) switchon circuit and vice versa. A falling edge of the signal /off of the opposite (highside) switchoff circuit is coupled to output signal /moderateon through capacitor C. Resistor R increases the impedance on node /moderateon so that it can be pushed down easily to a level where output of the NOR goes high and switches $M_3$ off and $M_4$ on thus latching signal /moderateon in the low state. Note that the capacitive coupling works equally well from lowside to highside. Now the 'moderate' PMOS driver $M_{pmoderate}$ is switched on and the transition at the output node of the class-D stage occurs causing the drain voltage $V_{drain}$ of the (lowside) power MOSFET to fall quickly and smoothly. When the drain voltage $V_{drain}$ falls below $V_{ddx}$ the transition is (nearly) finished and phase III starts. The source of inverter $M_6/M_7$ is pulled down through the back-gate diode of transistor $M_7$ and since the input signal in is high transistor $M_7$ is switched on and pulls down node /faston. This causes the 'fast' PMOS Mpfast to switch on that charges the gate of the (lowside) power MOSFET to its final value.

Figure 2:
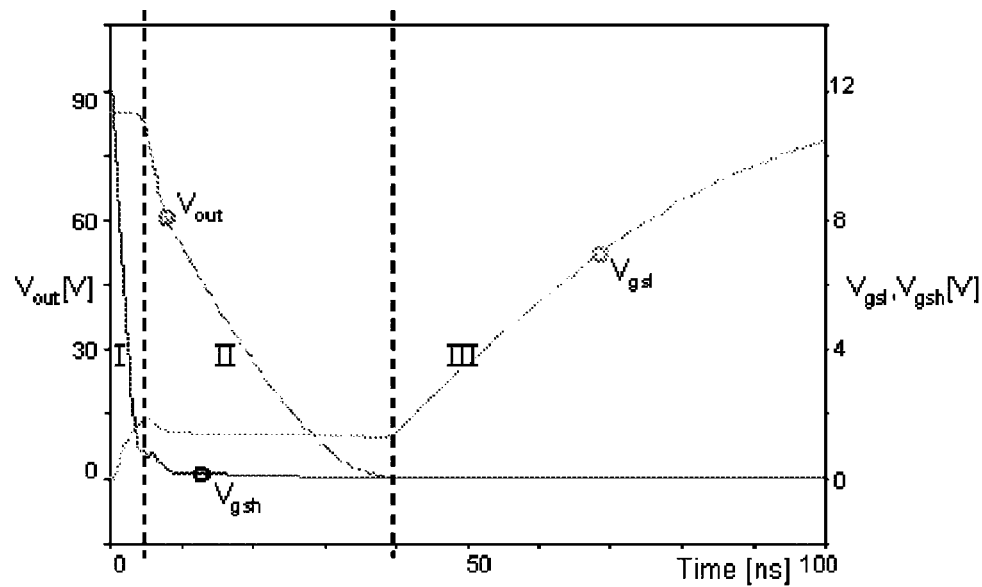
FIG. 2 depicts a typical waveform during falling transition.
Figure 3:
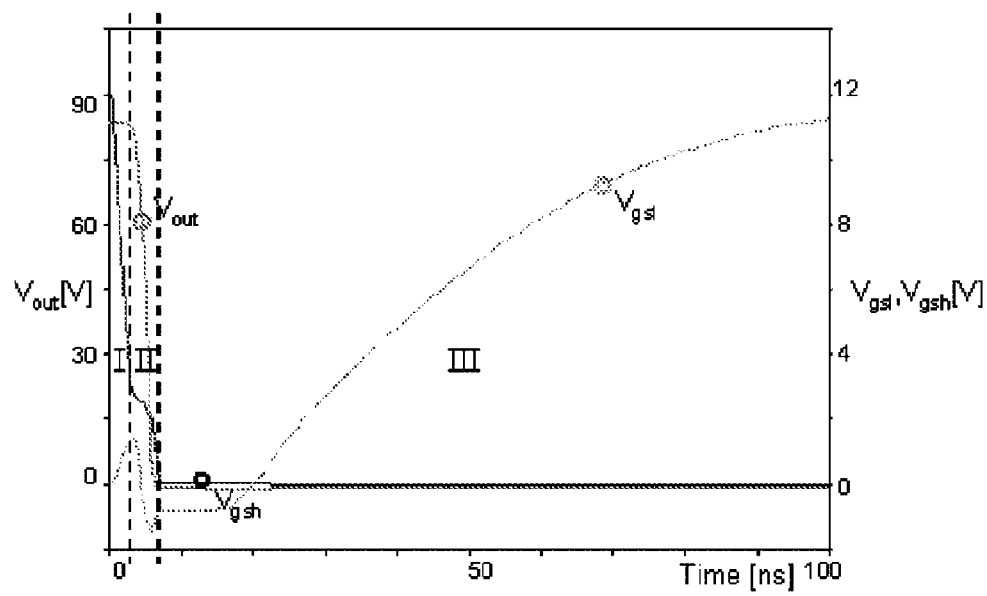
FIG. 3 depicts waveforms during a falling transition with current flowing from the output stage.
Figure 4:
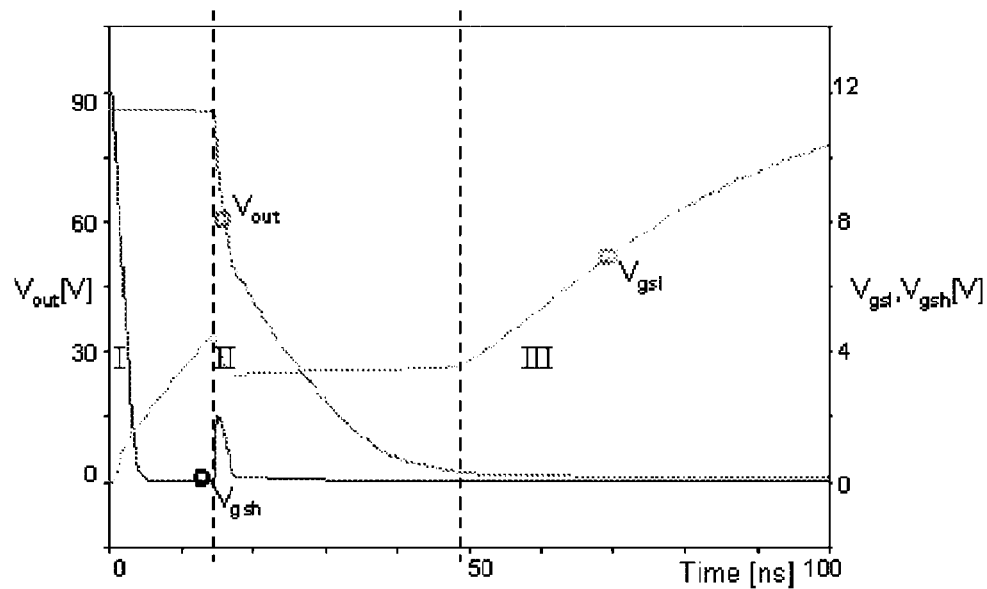
FIG. 4 depicts waveforms during a falling transition with current flowing towards the output stage.
Figure 10:
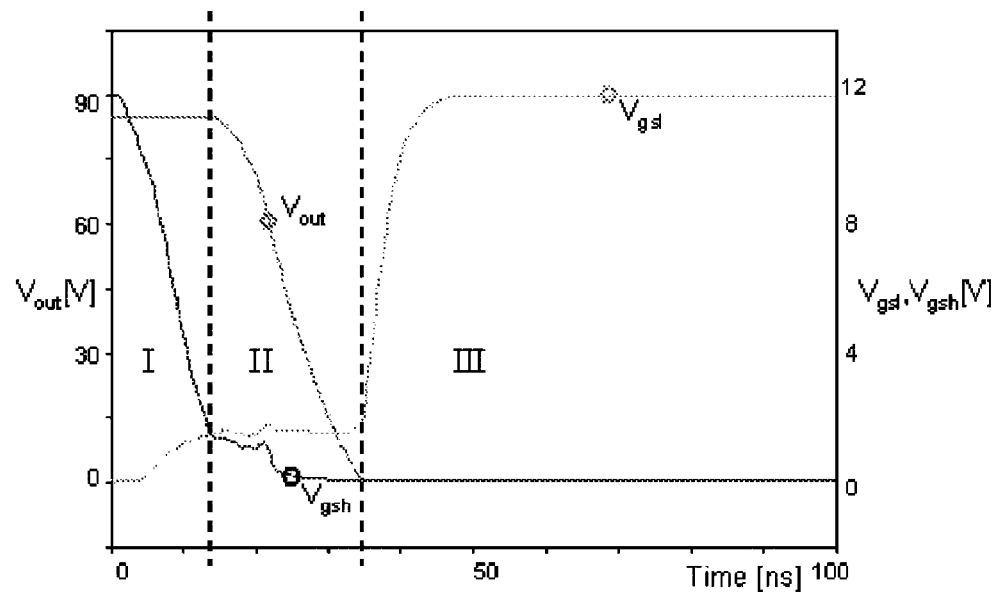
FIG. 10 depicts waveforms during falling transition, according to the invention.
Figure 11:
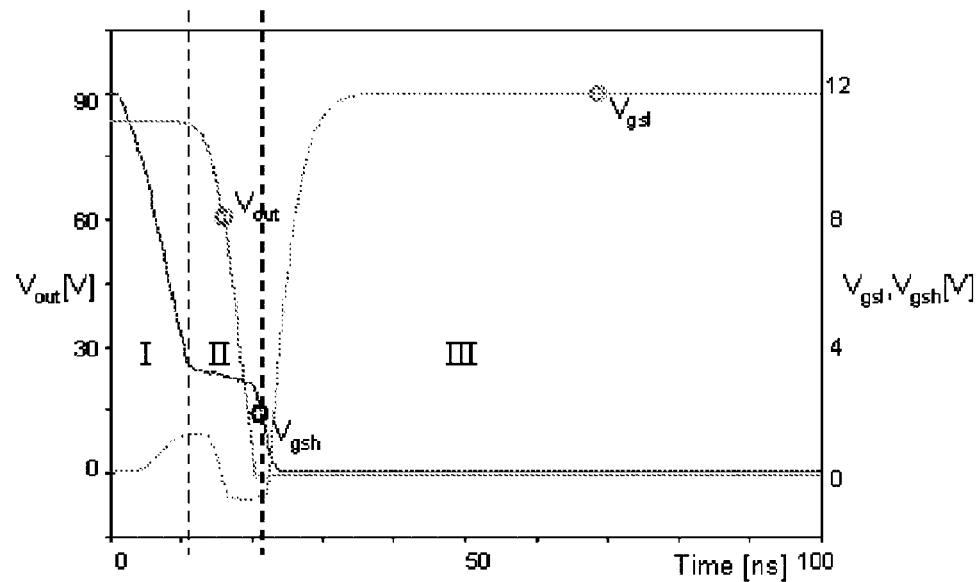
FIG. 11 depicts waveforms during a falling transition with current flowing from the output stage.
Figure 12:
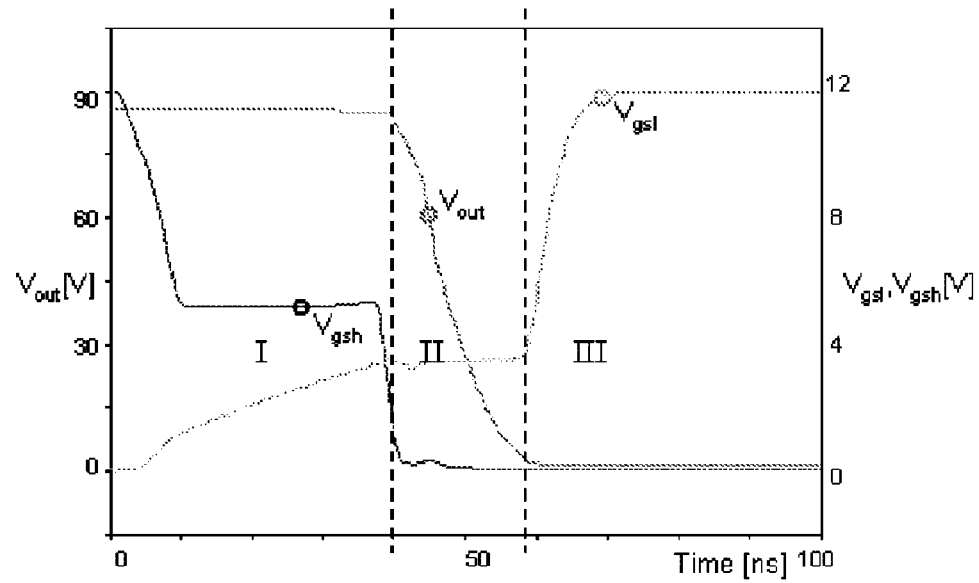
FIG. 12 depicts waveforms during falling transition with current flowing towards the output stage.

FIGS. 10, 11 and 12 show the waveforms in a class-D output stage according to the invention in the same cases as shown in FIGS. 2,3 and 5 respectively. Comparing FIG. 10 with FIG. 2 it appears that phase I is slower, phase II is faster and the final charging (phase III) is much faster. Comparing FIG. 11 with FIG. 3 it is apparent that phase II is now slower yielding a more gradual transition. Comparing FIG. 12 with FIG. 4 it appears that phase I has become slower resulting in a more gradual current build up in the lowside power MOSFET $M_L$. Also the overshoot in the gate-source voltage $V_{gsl}$ of the lowside power MOSFET $M_L$ has disappeared yielding a fast and smooth transition during phase II. Clearly can be seen that the gate-source voltage $V_{gsh}$ of the highside power MOSFET $M_H$ is held during phase I keeping $M_H$ conducting as long as current flows in the reverse direction and thus avoiding reverse recovery in the back-gate diode of $M_H$.

Figure 13:
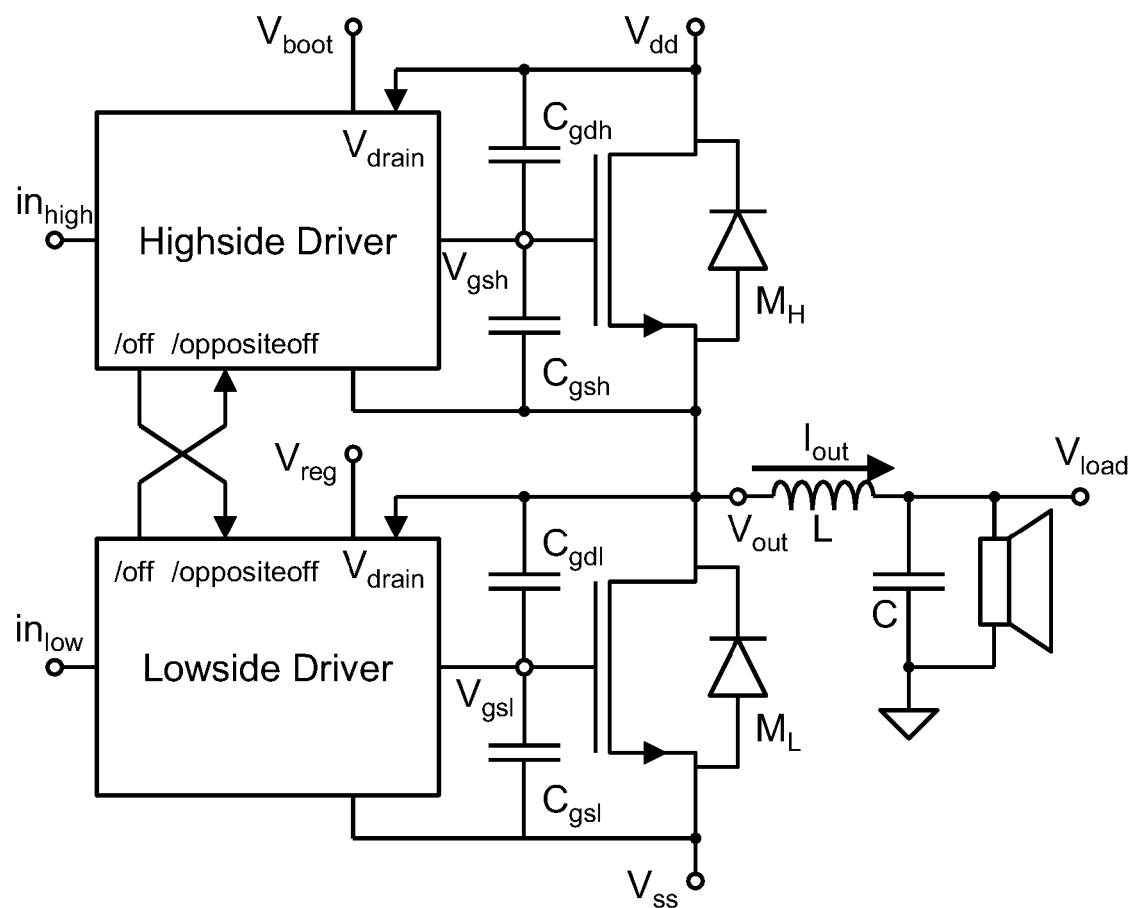
FIG. 13 depicts an embodiment of a power amplifier according to the invention.

FIG. 13 depicts an embodiment of a power amplifier according to the invention. The power amplifier comprises a driver Highside Driver, which drives the highside transistor $M_H$, the driver being coupled to another driver Lowside Driver, the other driver being coupled to the lowside transistor $M_L$. The first plurality of switches $M_{pslow}$, $M_{pmoderate}$, $M_{pfast}$ of each driver is coupled to their respective first control circuit switchon. The second plurality of switches $M_{nslow}$, $M_{nfast}$ of each driver being coupled to a respective second control circuit switchoff, the second control circuit switchoff being adapted to receive a PWM input signal in and to generate respective second controlling signals slowoff, fastoff, for each of the switches included in the second plurality of switches, respectively. Each of the second control circuit of the drivers Highside Driver, Lowside Driver provides an additional control signal $\overline{off}$ to the respective first control circuit of the other driver Lowside Driver, Highside Driver, and each of the second control circuit and generating respective first control $\overline{faston,moderate,slowon}$ signals for each of the switches included in the first plurality of switches.

Note although this description assumes a class-D output stage with n-type power MOSFETs, the invention can easily be adapted to output stages with complementary power MOSFETs.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A driver adapted to drive one or more final transistors included in a power amplifier, the driver comprising:
   a first plurality of switches having their respective main current channel coupled between a bias voltage terminal and a control electrode of the one or more final transistors, said first plurality of switches being selectively turned ON for enabling a progressive charging of the control electrode of the one or more final transistors, and
   a second plurality of switches having their respective main current channel coupled between a second bias voltage terminal and the control electrode of the one or more final transistors, said second plurality of switches being selectively switched ON until a current through the one or more final transistors changes its polarity.

2. The driver according to claim 1, wherein the first plurality of switches include p-MOS transistors having different sizes and wherein the second plurality of switches include n-MOS transistors having different sizes.

3. The driver according to claim 1, further comprising
   a second driver adapted to drive the one or more final transistors included in the power amplifier, the driver comprising a third plurality of switches having their respective main current channel coupled between a bias voltage terminal and a control electrode of the one or more final transistors, said third plurality of switches being selectively turned ON for enabling a progressive charging of the control electrode of the one or more final transistors, and a fourth plurality of switches having their respective main current channel coupled between a third bias voltage terminal and the control electrode of the one or more final transistors, said fourth plurality of switches being selectively switched ON until a current through the one or more final transistors changes its polarity,
   a first control circuit, and
   a second control circuit, wherein the second driver is coupled to said driver, and wherein
   the first and third plurality of switches of the driver and second driver are coupled to the first control circuit, the first control circuit adapted to receive a PWM input signal, and wherein
   the second and fourth plurality of switches of the driver and second driver are coupled to the second control circuit, the second control circuit adapted to receive the PWM input signal and to generate one or more second controlling signals for the second and fourth plurality of switches, wherein,
   the second control circuit provides a control signal to the first control circuit, and
   wherein the first control circuit generates one or more first controlling signals for the first and third plurality of switches.

4. The driver according to claim 3, wherein the second control circuit comprises:
   a first comparator for comparing voltages at both ends of a main current channel of the one or more final transistors and generating a first comparator signal,
   a second comparator for comparing a threshold voltage of the one or more final transistors with a voltage of the control electrode of the same one or more final transistors and generating the control signal, and
   logic circuitry for combining the PWM input signal with the control signal and the first comparator signal, the logic circuitry generating respective one or more second controlling signals for control electrodes of the second and fourth plurality of switches.

5. The driver according to claim 4, wherein the second comparator includes an inverter, a first transistor, and a second transistor having a substantially smaller size than the first transistor, said first and second transistors having their respective control electrodes coupled to each other and further coupled to the control electrode of the one or more final transistors.

6. The driver according to claim 4, wherein the first comparator is a current comparator for comparing a current through the one or more final transistors.

7. The driver according to claim 3, wherein the first control circuit comprises a first inverter coupled to a second inverter, the second inverter being controlled by a back-gate diode of said inverter.

8. The driver according to claim 7, wherein the first control circuit further comprises a latch circuit that is that is reset by the PWM input signal, said latch being set by the control signal.

* * * * *